United States Patent [19]
Bushman et al.

[11] Patent Number: 5,530,403
[45] Date of Patent: Jun. 25, 1996

[54] LOW-VOLTAGE DIFFERENTIAL AMPLIFIER

[75] Inventors: Michael L. Bushman, Hanover Park; Lawrence E. Connell, Naperville, both of Ill.

[73] Assignee: Motorola, Inc., Schaumburg, Ill.

[21] Appl. No.: 432,646

[22] Filed: May 3, 1995

[51] Int. Cl.$^6$ ........................................ H03F 3/45
[52] U.S. Cl. .................................. 330/253; 330/260
[58] Field of Search ............................ 330/253, 260

[56] References Cited

U.S. PATENT DOCUMENTS 5,442,318  8/1995  Badyal et al. .................... 330/253

OTHER PUBLICATIONS

Fisher, "A High-Performance CMOS Power Amplifier", *IEEE Journal Of Solid-State Circuits*, vol. SC-20, No. 6 Dec. 1985, pp. 1200–1205.

"A Compact Power-Efficient 3 V CMOS Rail-to-Rail Input/Output Operational Amplifier for VLSI Cell Libraries," IEEE Journal of Solid-State Circuits, vol. 29, No. 12, Dec. 1994; R. Hogervorst, J. Tero, R. Eschauzier and J. Huijsing; pp. 1505–1513.

*Primary Examiner*—James B. Mullins
*Attorney, Agent, or Firm*—Gary J. Cunningham

[57] ABSTRACT

A low-voltage differential amplifier (10) includes a circuit (12) having a differential pair (14) and loads (22 and 24). The first load (22) can include a first embedded differential amplifier (30) and an output transistor (32) and the second load (24) can include a second embedded differential amplifier (36) and an output transistor (38). The differential amplifier (10) can provide a wide-voltage operable range. The differential amplifier (10) is particularly useful in connection with low-voltage temperature compensated crystal oscillators.

17 Claims, 2 Drawing Sheets

LOW-VOLTAGE DIFFERENTIAL AMPLIFIER

FIELD OF INVENTION

This invention relates generally to differential amplifiers, and particularly to low-voltage differential amplifiers.

BACKGROUND OF THE INVENTION

FIG. 1 shows a conventional, fully differential amplifier stage. It includes a differential gain pair M1 and M2, load pair M3 and M4, and a current source M5. The lower limit of the common mode input voltage is given by $$Vlow = Vdsat_{m5} + Vdsat_{m2} + Vt_{m2},$$

wherein $Vdsat_{mx}$ represents the saturation voltage of transistor mx and $Vt_{mx}$ represents the threshold voltage of transistor mx.

The upper limit of the common mode input voltage is given by $$Vhigh = Vdd - Vdsat_{m4} Vt_{m4} + Vt_{m2}.$$

Typically, $V_t = 0.75$ v and Vdsat=0.1 V. With these values, the operation of the differential amplifier ceases when Vlow=Vhigh.

$$Vdsat_{m5} + Vdsat_{m2} + Vt_{m2} = Vdd - Vdsat_{m4} - Vt_{m4} + Vt_{m2}$$

$$3Vdsat + Vt_{m4} = Vdd = 1.05$$

At this voltage (Vdd=1.05), the amplifier has no usable input range. When operated at 2.7 volts=Vdd, the usable input range is 0.95 v to 2.6 v or 1.65 volts. In many applications, this range may be inadequate (see item 102 in FIG. 5). The input range may be moved (translated) by the use of zero threshold devices for M1 and M2 (i.e.: $Vt_{m2} = 0.0$ v), however no additional usable input range is gained (see; item 100 in FIG. 5). Note that a zero threshold device is not available to replace M3 and M4.

It would be considered an improvement in the art, if a low-voltage differential amplifier could be made, with a wide; operable voltage range.

DETAILED DESCRIPTION OF THE PREFERRED EMBODIMENT

Figure 2:
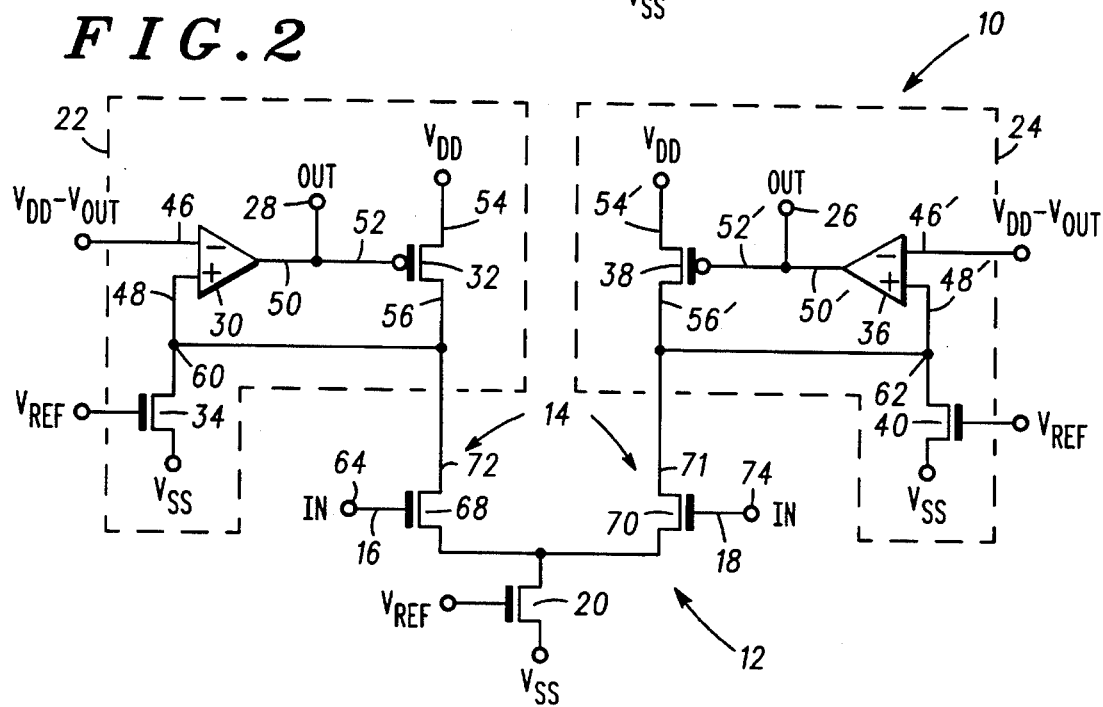
FIG. 2 is a simplified circuit diagram of a low-voltage differential amplifier, in accordance with the present invention.

Referring to FIG. 2, a low-voltage differential amplifier 10 is shown. The low-voltage differential amplifier 10 includes a differential amplifier circuit 12, which includes a differential pair 14 having an inverting input 16 and a non-inverting input 18 and a bias current source 20 connected to the differential pair 14, and first and second loads 22 and 24, and inverted and non-inverted outputs 26 and 28. The first load includes a first embedded differential amplifier 30, a first output transistor 32 and a first current source 34. Likewise, the second load 24 includes a second embedded differential amplifier 36, second output transistor 38 and second current source 40.

The first and second loads 22 and 24 provide a means of maintaining operation of output transistors 32 and 38 in their saturation regions substantially independent of the input voltages at the inverting and non-inverting inputs 16 and 18. The source to drain voltages of output transistors 32 and 38 are fixed at a nominal value, $Vdsat_{32}$, by embedded differential amplifiers 30 and 36 and a first and a second reference voltage. In this configuration, the upper limit of the common mode input voltage is given by $$Vhigh = Vdd - Vdsat_{32} + Vt_{68},$$

and the lower limit of the common mode input voltage is still given by $$Vlow = Vdsat_{20} + Vdsat_{68} + Vt_{68}.$$

With the typical values Vt=0.75 v and Vdsat=0.1 V and Vdd=2.7 v, the common mode input range for the differential amplifier is $$Vhigh = 2.7\ V - 0.1\ V + 0.75\ V = 3.35\ V,$$

$$Vlow = 0.1\ V + 0.1\ V + 0.75\ V = 0.95.$$

Figure 4:
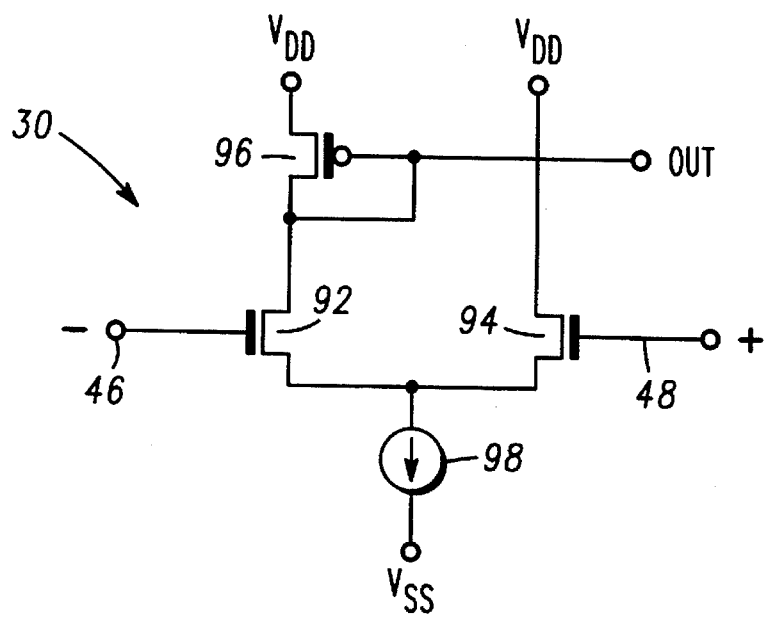
FIG. 4 is a circuit diagram of an alternate embodiment of an embedded differential amplifier for use in connection with the low-voltage differential amplifier in FIG. 2, in accordance with the present invention.

This substantially improves the operating range of the low-voltage differential amplifier 10 (substantially as shown in FIG. 4, item 104). The upper limit of the common mode input voltage can be brought below Vdd by employing zero threshold devices for the differential pair 14. The common mode input range for the differential amplifier is then $$Vhigh = 2.7\ V - 0.1\ V + 0.0\ V = 2.6\ V$$

and $$Vlow = 0.1\ V + 0.1\ V + 0.0\ V = 0.2\ V$$

(substantially as shown in FIG. 4, range 106).

Referring to FIG. 2, the first load 22 includes a first embedded differential amplifier (Diff. Amp) 30 having a first inverting input 46 and a first non-inverting input 48. The first output transistor 32 includes a gate, source and drain 52, 54 and 56, respectively. The first current source 34 is connected to the first non-inverting input 48 and the drain 56 of the first output transistor 32. A first common node connection is shown as item 60. The current source 34 is capable of sinking current from the first output transistor 32. The first embedded differential amplifier output 50 is connected to the gate 52 of the p-channel transistor 32.

This configuration employs a negative feedback path from the drain 56 of the first output transistor 32 to the non-inverting input 48 of the first embedded differential amplifier 30. This negative feedback establishes a fixed nominal source 54 to drain 56 voltage, for the first output transistor 32. The first current source 34 provides frequency stabilization for the circuit by ensuring output transistor 32 will substantially always be biased on with a drain current whose value is greater than or equal to the value of the current source. 34 when differential pair 14 draws minimal current from output transistor 32. The output of the first embedded differential amplifier 50 provides an output voltage at the non-inverted output 28 which is a function of the drain 56 current of the first output transistor 32. As the drain 56 current increases, the voltage at non-inverted output 28 decreases.

The differential pair 14 includes inverting and non-inverting input transistors 68 and 70. A drain 72 of the inserting input transistor 68 is connected to the common connection node 60. The gate 52 of the first output transistor 32, is connected to the embedded differential amplifier output 50. The drain 56 is connected to the first common connection node 60, and the first source 54 is connected to a DC power supply, such as Vdd, sufficient to allow current to flow through at least part of the differential pair 14.

In one embodiment, the first embedded differential amplifier output 50 defines at least one of the inverted and non-inverted outputs 26 and 28. In a preferred embodiment, as shown in FIG. 2, the first load 22 is the load for the inverting input transistor 68 of the differential pair 14. The inverting input 46 includes a connection to a first voltage reference, such as Vdd–Vdsat, which typically ranges from about 50 mV below Vdd to about 200mV below Vdd. Preferably, the first voltage reference is very close to Vdd, since it's deviation from Vdd will reduce the common mode input range of the circuit.

The second load 24 functions substantially similar to that described in connection with the first load 22.

More particularly, the second load 24 includes a second embedded differential amplifier 36 having a second inverting input 46' and a second non-inverting input 48'. The second output transistor 38 includes a gate, source and drain 52' 54' and 56' respectively.

The second current source 40 is connected to the second non-inverting input 48' and the drain 56' of the second output transistor 38. A second common node connection is shown as item 62. The current source 40 is capable of sinking current from the second output transistor 38.

The embedded differential amplifier output 50' is connected to the gate 52' of output transistor 38. In one embodiment, the second embedded differential amplifier output 50' defines an inverted output 26.

The second inverting input 46' includes a connection to a second voltage reference, such as Vdd-Vdsat, which typically ranges from about 50 mV below Vdd to about 200 mV below Vdd. Preferably, the second voltage reference is very close to Vdd, since it's deviation from Vdd will reduce the common mode input range of the circuit.

The gate 52' of the transistor 38, is connected to the second embedded differential amplifier output 50'. The drain 56' is connected to the second common connection node; 62, and the source 54' is connected to a DC power supply, such as Vdd, sufficient to allow current to flow through at least part of the differential pair 14, such as non-inverting transistor 70.

In FIG. 2, a first input voltage 64 is applied at inverting input 16, and a second input voltage 74 is applied at non-inverting input 18. The sum of the current through inverting transistor 68 and non-inverting transistor 70 of the differential pair 14 will combine to equal the current through bias current source 20. If the first input voltage 64 applied to inverting input 16 is less than the second input voltage 74 applied to non-inverting input 18, then the current from the drain 56 of the output transistor 32 will be less than the current from the drain 56' of the output transistor 38. The voltage at non-inverting output 28 is a function of the drain 56 current, and the voltage at inverted output 26 is a function of the drain 56' current. Therefore, if the input voltage difference between non-inverting input 18 and inverting input 16 is positive, the voltage difference between non-inverting output 28 and inverted output 26 will be a positive function of the input voltage difference. This defines the transfer function for the circuit:

$$H(s)=(Vout28-Vout26)/(Vin18-Vin16).$$

The minimum common mode input voltage Vlow for the circuit, is that operating point where Vlow is applied to both inverting input 16 and non-inverting input 18, and is a value sufficiently low to cause bias current source 20 to cease operation in the saturation region and begin to operate in the linear region. When this occurs, the sum of the current through inverting transistor 68 and noninverting transistor 70 of differential pair 14 is substantially less than the current bias current source 20 is intended to provide, and the transfer function for the circuit is no longer appropriate. The maximum common me, de input voltage Vhigh for the circuit, is that operating point where Vhigh is applied to both inverting input 16 and non-inverting input 18, and is a value sufficiently high to cause inverting transistor 68 and non-inverting transistor 70 of differential pair 14 to cease operation in the saturation region and begin to operate in the linear (or triode) region. When this occurs, inverting transistor 68 and non-inverting transistor 70 of the differential pair 14 no longer operate as voltage controlled current sources, but as voltage controlled resistors. With the common mode input voltage this high, the voltage gain of the differential pair 14 is substantially reduced and the transfer function for the circuit iS no longer appropriate.

Figure 3:
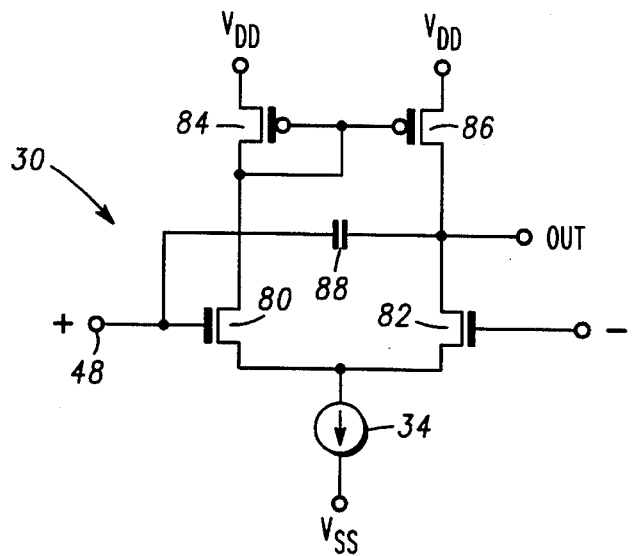
FIG. 3 is a circuit diagram of an embedded differential amplifier for use in connection with the low-voltage differential amplifier in FIG. 2, in accordance with the present invention.

FIG. 3 is a circuit diagram of a single-stage, single-ended output differential amplifier, for use as the first or second embedded differential amplifier 30 or 36. The embedded differential amplifier 30 shown in FIG. 3, can have first through fourth transistors 80, 82, 84 and 86 with a capacitive coupling 88 connecting the gate of transistor 80 with the drains of transistors 82 and 86.

In a preferred embodiment, the differential amplifier 30 is connected to the output transistor 32 and a current source 34. Likewise, the differential amplifier 36 is connected to the output transistor 38 and current source 40, as shown in FIG. 2. The drain 72 of inverting transistor 68 is connected to the drain 56 of the output transistor 32. Likewise, the drain 71 of the non-inverting transistor 70 is connected to the drain 56' of the output transistor 38. This generally describes the connection between the differential pair 14 and the loads 22 and 24.

FIG. 4 is a circuit diagram of an alternative single-ended output differential amplifier, for use as the first or second embedded differential amplifier 30 or 36. The embedded differential amplifier 30 shown in FIG. 4 can have first through third transistors 92, 94 and 96, and a current source 98. When connected to output transistors 32 and 38 of loads 22 and 24, negative feedback exists which will fix nodes 60 and 62 at the reference voltage applied to nodes 46 and 46'. In one embodiment, if the configuration shown in FIG. 4 is used to replace the embedded differential amplifiers 30 and 36 in FIG. 2, the current sources 34 and 40 are not required for stable operation.

Figure 5:
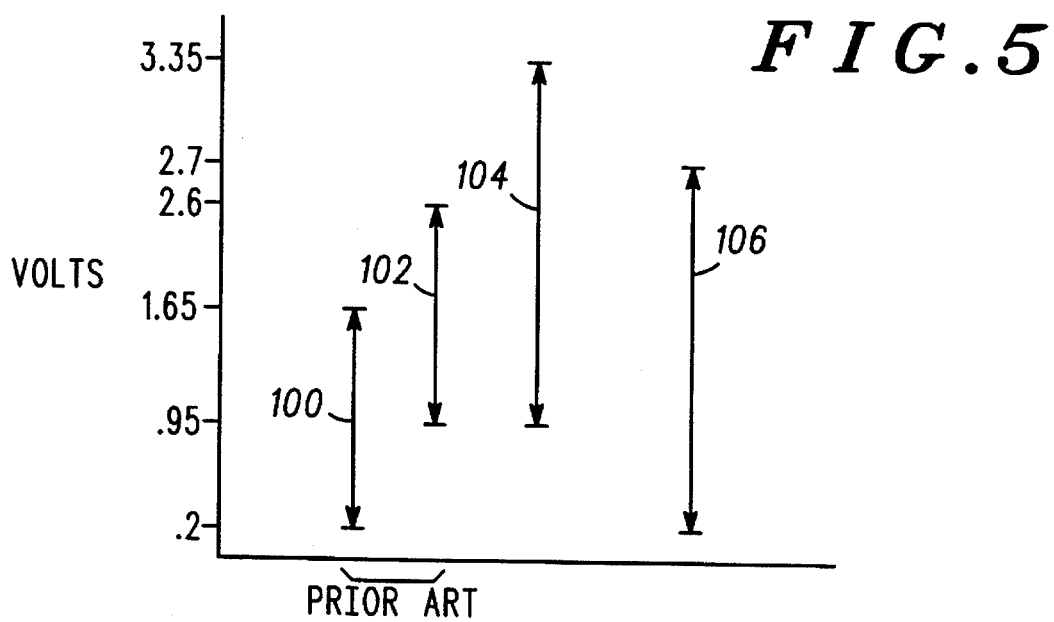
FIG. 5 is a diagram having a vertical axis in volts, showing various voltage ranges for the prior art differential amplifier in FIG. 1 compared to the low-voltage differential amplifier and components in FIGS. 2 and 3, in accordance with the present invention.

In FIG. 5, first, second, third and fourth voltage ranges are shown as items 100, 102, 104 and 106. The first and second ranges 100 and 102 correspond to the voltage range for the prior art device in FIG. 1.

Figure 1:
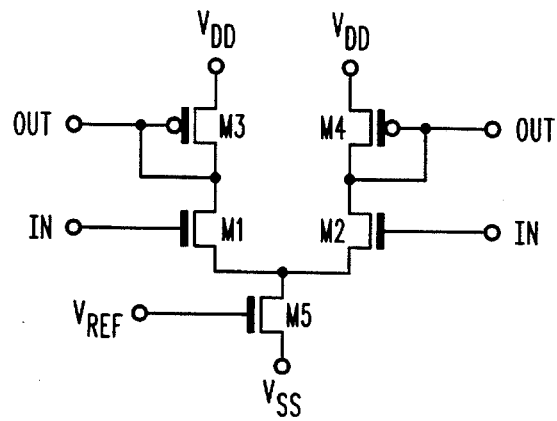
FIG. 1 is a simplified circuit diagram of a prior art fully differential amplifier.

The first range shows a usable prior art voltage range of from about 0.2 volts to about 1.65 volts, provided 0.0 volt threshold devices are used for M1 and M2 in FIG. 1. The second range 102 shows a usable prior art voltage range of from about 0.95 volts to about 2.6 volts, thus providing a usable range of about 1.65 volts, provided 0.75 volt threshold devices are used for M1 and M2 in FIG. 1. The selection of 0.0 volt or 0.75 volt threshold devices does not increase the usable common mode input range for the circuit, but merely translates the common mode input range up or down by 0.75 volts depending upon the devices selected.

The third and fourth ranges 104 and 106 correspond to the voltage range for the circuit shown in FIG. 2, in accordance with the present invention. Advantageously, ranges 104 and 106 are wider than those in the prior art in FIG. 1.

More particularly, the third range 104 provides a range of from about 0.95 volts to about 3.35 volts, thus providing a usable range of about 2.40 volts (in FIG. 2), provided 0.75 volt threshold devices are used for inverting transistor 68 and non-inverting transistor 70. The voltage range above 2.7 volts is unusable if the input voltages are constrained to be between Vdd and Vss, however the common mode input range has been increased by 0.75 volts.

The fourth range 106 provides a usable voltage range of from about 0.2 volts to about 2.60 volts, providing a usable range of about 2.40 volts, provided 0.0 volt threshold devices are used for inverting transistor 68 and non-inverting transistor 70. In this example, the entire common mode input range is between the power supply limits of Vdd and Vss, and the entire range is typically usable by circuitry constrained to that common power supply.

This invention is particularly useful in the implementation of a temperature compensation circuit for low voltage temperature compensated crystal oscillators, where a low voltage fully differential amplifier with a wide common mode input voltage is necessary to generate a piece wise linear function. Advantageously, the invention's wide common mode range allows for a wide range of temperature operation with better noise performance than the prior art. More particularly, the ranges 104 and 106 provide for receiving a larger input signal which results in an improved signal to noise ratio.

Although various embodiments of this invention have been shown and described, it is to be understood that various modifications and substitutions, as well as, rearrangements and combinations of the preceding embodiments can be made by those skilled in the art without departing from the novel spirit and scope of this invention.

What is claimed is:

1. A low-voltage differential amplifier, comprising:
   a differential amplifier circuit including:
   (i) a differential pair including an inverting input and a non-inverting input and a bias current source connected to the differential pair; and
   (ii) first and second load and inverted and non-inverted outputs;
   the first load comprises a first embedded differential amplifier and a first output transistor,
   the first embedded differential amplifier includes a first inverting input and a first non-inverting input and a first embedded differential amplifier output and the first output transistor includes a first gate, source and drain, the first source is adapted to being connected to a power supply to allow current to flow through at least part of the differential pair,
   the first non-inverting input, the differential pair and the first drain of the first output transistor are connected and define a first common connection node; and
   the second load comprises a second embedded differential amplifier, and a second output transistor.

2. The low-voltage differential amplifier of claim 1, wherein the common connection node is connected to a drain of the differential pair, a drain of the first output transistor and the first non-inverting input.

3. The low-voltage differential amplifier of claim 1, wherein the first embedded differential amplifier output is connected to the first gate.

4. The low-voltage differential amplifier of claim 1, wherein the output of the first embedded differential amplifier defines at least one of the inverted and non-inverted outputs.

5. The low-voltage differential amplifier of claim 1, wherein the first inverting input includes a connection to a first DC voltage reference.

6. The low-voltage differential amplifier of claim 5, wherein the first DC voltage reference is sufficient to bias the first output transistor in the saturation region.

7. The low-voltage differential amplifier of claim 1, wherein the differential pair includes inverting and non-inverting transistor is connected to the first common connection node.

8. The low-voltage differential amplifier of claim 1, wherein the first gate is connected to the output of the first embedded differential amplifier, the first drain and a first current source is connected to the first common connection node, the first source is connected to a DC power supply sufficient to allow current to flow through at least part of the differential pair.

9. The low-voltage differential amplifier of claim 1, wherein the second embedded differential amplifier includes a second inverting input and a second non-inverting input and a second embedded differential amplifier output, and the second output transistor includes a second gate, source and drain.

10. The low-voltage differential amplifier of claim 9, further comprising a second current source connected to the second non-inverting input and the second drain of the second output transistor, defining a second common connection node, whereby the second current source is capable of sinking or sourcing from the second output transistor.

11. The low-voltage differential amplifier of claim 10, wherein the differential pair includes inverting and non-inverting transistors, a drain of the non-inverting transistor is connected to the second common connection node.

12. The low-voltage differential amplifier of claim 10, wherein the second gate is connected to the output of the second embedded differential amplifier, the second drain is connected to the second common connection node, and the second source is connected to a DC power supply sufficient to allow current to flow through at least part of the differential pair.

13. The low-voltage differential amplifier of claim 9, wherein the second embedded differential amplifier output is connected to the second gate.

14. The low-voltage differential amplifier of claim 9, wherein the second embedded differential amplifier output defines at least one of the inverted and non-inverted outputs.

15. The low-voltage differential amplifier of claim 9, wherein the second inverting input includes a connection to a second DC voltage reference.

16. The low-voltage differential amplifier of claim 15, wherein the second DC voltage reference is sufficient to bias the second output transistor in its saturation region.

17. A low-voltage differential amplifier, comprising:
a differential amplifier circuit including:
  (i) a differential pair including an inverting input and a non-inverting input and a bias current source connected to the differential pair; and
  (ii) first and second load and inverted and non-inverted outputs;
the first load comprises a first embedded differential amplifier and a first output transistor,
the first embedded differential amplifier includes a first inverting input and a first non-inverting input and a first embedded differential amplifier output and the first output transistor includes a first gate, source and drain,
the first source is adapted to being connected to a power supply to allow current to flow through at least part of the differential pair,
the first non-inverting input, the differential pair and the first drain of the finest output transistor are connected and define a first common connection node, the common connection node is further connected to a drain of the differential pair, a drain of the first output transistor and the first non-inverting input; and
the second load comprises a second embedded differential amplifier, and a second output transistor.

* * * * *